US009013260B2

(12) United States Patent
Tornkvist et al.

(10) Patent No.: US 9,013,260 B2
(45) Date of Patent: Apr. 21, 2015

(54) CABLE AND ELECTROMAGNETIC DEVICE COMPRISING THE SAME

(71) Applicants: Christer Tornkvist, Stromsholm (SE); Goran Eriksson, Vasteras (SE); Jan Hajek, Ludvika (SE); Joachim Schiessling, Enkoping (SE); Manoj Pradhan, Balsta (SE)

(72) Inventors: Christer Tornkvist, Stromsholm (SE); Goran Eriksson, Vasteras (SE); Jan Hajek, Ludvika (SE); Joachim Schiessling, Enkoping (SE); Manoj Pradhan, Balsta (SE)

(73) Assignee: ABB Research Ltd. (CH)

( * ) Notice: Subject to any disclaimer, the term of this patent is extended or adjusted under 35 U.S.C. 154(b) by 0 days.

(21) Appl. No.: 14/047,610

(22) Filed: Oct. 7, 2013

(65) Prior Publication Data

US 2014/0035712 A1 Feb. 6, 2014

Related U.S. Application Data

(63) Continuation of application No. PCT/EP2012/056263, filed on Apr. 5, 2012.

(60) Provisional application No. 61/472,912, filed on Apr. 7, 2011.

(51) Int. Cl.

*H01F 17/06* (2006.01)
*H05K 9/00* (2006.01)
*H01F 5/00* (2006.01)
*H01F 27/28* (2006.01)

(52) U.S. Cl.

CPC .............. *H01F 5/00* (2013.01); *H01F 27/2823* (2013.01); *H01F 27/288* (2013.01)

(58) Field of Classification Search

CPC ..... B22F 1/02; H01F 10/16; H01F 2001/348; H01F 2017/0053; H01F 2003/005; H01F 2017/0066; H01F 41/046; H01B 11/143; H01B 11/14

USPC .............. 336/175, 185, 209, 221; 174/32, 36, 174/350, 388, 391

See application file for complete search history.

(56) References Cited

U.S. PATENT DOCUMENTS

| | | | | |
|---|---|---|---|---|
| 1,586,883 | A * | 6/1926 | Elmen | 178/45 |
| 1,700,766 | A * | 2/1929 | Kemp | 178/45 |
| 3,653,986 | A | 4/1972 | Pingel | |
| 4,301,428 | A * | 11/1981 | Mayer | 333/12 |

(Continued)

FOREIGN PATENT DOCUMENTS

| | | | |
|---|---|---|---|
| GB | 1035109 | A | 7/1966 |
| GB | 1055452 | A | 1/1967 |

(Continued)

OTHER PUBLICATIONS

"A Critical Comparison of Ferrites with Other Magnetic Materials" Jan. 1, 2000; Magnetics—All Rights Reserved; 11 pages.

(Continued)

*Primary Examiner* — Alexander Talpalatski
*Assistant Examiner* — Joselito Baisa
(74) *Attorney, Agent, or Firm* — St. Onge Steward Johnston & Reens LLC

(57) ABSTRACT

A cable for winding of an electromagnetic device. The cable includes a conductor, and a layer including a magnetic material having a relative permeability in the range 2 to 100000, wherein the layer at least partly surrounds the conductor.

18 Claims, 5 Drawing Sheets

(56) References Cited

U.S. PATENT DOCUMENTS

| | | | | | |
|---|---|---|---|---|---|
| 4,383,225 | A * | 5/1983 | Mayer | 333/12 | |
| 4,852,252 | A * | 8/1989 | Ayer | 29/860 | |
| 4,987,283 | A * | 1/1991 | Beinhaur et al. | 219/616 | |
| 4,995,838 | A * | 2/1991 | Ayer et al. | 439/874 | |
| 6,091,025 | A * | 7/2000 | Cotter et al. | 174/110 R | |
| 2001/0052837 | A1 | 12/2001 | Walsh | | |
| 2010/0188079 | A1* | 7/2010 | Ueda et al. | 324/260 | |
| 2011/0198118 | A1* | 8/2011 | Fang et al. | 174/391 | |

FOREIGN PATENT DOCUMENTS

| | | | |
|---|---|---|---|
| GB | 2331857 | A | 6/1999 |
| JP | S59144107 | A | 8/1984 |
| JP | H093692 | A | 1/1997 |
| JP | 2006073350 | A | 3/2006 |
| JP | 2006222322 | A | 8/2006 |
| WO | 02095775 | A1 | 11/2002 |

OTHER PUBLICATIONS

R. K. Rajput: "A Text Book of Electrical Engineering"; Jan. 1, 2003; Laxmi Publications LTD; pp. 263-264.

V. N. Mittle, et al.; "Basic Electrical Engineering"; Jan. 1, 2006; Tata McGraw-Hill Publishing Company Limited; p. 601.

International Preliminary Report on Patentability Application No. PCT/EP2012/056263 Completed: Jun. 17, 2013 17 pages.

International Search Report and Written Opinion of the International Searching Authority Application No. PCT/EP2012/056263 Completed: May 30, 2012; Mailing Date: Jun. 11, 2012 18 pages.

S. L. Kakani; "Material Science" Jan. 1, 2004; New Age International Publishers; 3 pages.

C. James Erickson, et al.; "Section 15 Electrical Engineering"; Jan. 1, 2013; 91 pages.

* cited by examiner $\mu_r = 1$ $\mu_r = 100$ $\mu_r = 500$

CABLE AND ELECTROMAGNETIC DEVICE COMPRISING THE SAME

FIELD OF THE INVENTION

The present disclosure generally relates to electric power systems and in particular to a cable for windings of an electromagnetic device and to an electromagnetic device having windings comprising such a cable.

BACKGROUND OF THE INVENTION

Electromagnetic devices, such as transformers and reactors, are used in power systems for voltage level control. Hereto, a transformer is an electromagnetic device used to step up and step down voltage in electric power systems in order to generate, transmit and utilize electrical power in a cost effective manner. In a more generic sense a transformer has two main parts, a magnetic circuit, the core, made of e.g. laminated iron and an electrical circuit, windings, usually made of aluminium or copper wire.

Larger transformers used in electrical power networks are generally designed with high efficiency and with a set of stringent operational criteria, e.g. dielectric, thermal, mechanical and acoustic criteria. Due to continuously increasing power handling capacity, i.e. power and voltage rating of transformers, transformer designs face more and more constraints.

Modern practices of transformer design involve inter alia balancing the use of materials in the core and winding, and losses. Due to the large amount of power handled by a large power transformer and due to long service life, typically 40 years, any improvement in reduction of losses would be appreciable, if it can be justified by the cost.

Power Loss in transformers due to load currents is a large part of the total losses. The load loss (LL) consists of perceivably three different types of losses based on their origin, i) the $I^2R$ losses due to inherent resistance of winding conductors, also called DC loss, ii) the eddy current loss (ECL) in the windings due to the time-varying magnetic field created by the load current in all winding conductors, the leakage field and iii) the stray losses, i.e. ECL in other structural parts of the transformer due to the leakage field.

Current solutions for reducing eddy current losses include multi-strand continuously transposed cables (CTC). These cables require stronger copper in order to be able to handle short circuits in high voltage applications. Moreover, the manufacturing of CTC cables having a plurality of sufficiently thin and transposed strands is a very expensive process and requires gluing and insulation of the strands by means of epoxy. The material cost of high voltage inductive devices hence increases tremendously.

SUMMARY OF THE INVENTION

An object of the present disclosure is to provide a cable for windings of an electromagnetic device, which cable reduces losses in the winding when in a loaded condition at a lower cost than has previously been possible.

Thus, in a first aspect of the present disclosure, there is provided a cable for a winding of an electromagnetic device, wherein the cable comprises: a conductor, and a layer comprising a magnetic material having a relative permeability in the range 2 to 100000, wherein the layer at least party surrounds the conductor.

With relative permeability of the magnetic material is meant relative magnetic permeability $\mu_r$ of the magnetic material throughout this text.

By providing a suitably chosen thin layer of magnetic material with reasonably high relative permeability compared to the material of which the conductor is made, at least partly around the conductor, the leakage flux will redistribute to be partially confined to the layer and thereby substantially reduce the eddy current losses in the conductor. Thus, the operation of an electromagnetic device comprising the present cable may perform more efficiently. In particular, with optimised magnetic material parameters for a particular application, it is envisaged that the loss reduction may be in the order of from 5-10%.

Moreover, due to the magnetic material, more magnetic energy can be stored in the cable and thus the winding, whereby the ability of large electromagnetic devices to withstand the occurring force due to short circuit current is improved. In other words the impedance of an electromagnetic device arranged with the cable presented herein can be controlled by means of the magnetic material. To this end, the cable according to the present disclosure may be particularly advantageous for high voltage applications where high currents are present, thus resulting in high losses. It is to be noted, however, that the cable could also be used for medium voltage applications and even low voltage applications.

Furthermore, due to the eddy current loss reduction provided by the magnetic material, the cable cross section can be made solid, or the cable can be manufactured with a fewer number of strands, with each strand having a thicker cross-sectional dimension. Further the need for stronger copper material, i.e. the Yield strength, is reduced. Strands with thicker dimension are less expensive to manufacture, thereby reducing the costs for manufacturing the cable.

According to one embodiment, the relative permeability of the magnetic material is in the range of 10 to 500. Alternatively, the relative permeability of the magnetic material is in the range 100-5000. Tests have shown that for relative permeability values in this range, especially above 300, a highly reduced total eddy current loss per winding layer or disc can be provided when the cable is arranged as a winding for an electromagnetic device.

According to one embodiment, the layer fully surrounds the conductor.

According to one embodiment, the magnetic material is ferromagnetic.

One embodiment comprises several concentrically arranged layers.

According to the concentrically arranged embodiment, one of the layers comprises a semiconducting material.

According to one embodiment the layer is thicker on those surfaces of the conductor which present the innermost or outermost turns of a winding for a specific application when the cable is formed as a winding.

According to one embodiment the coating comprises an electrically insulating material with magnetic properties, wherein the magnetic properties are provided by the magnetic material.

According to one embodiment the magnetic material is dispersed in the composite insulating material in the form of magnetic particles.

According to one embodiment the electromagnetic device is a high voltage electromagnetic device.

According to one embodiment the electromagnetic device is a power transformer.

According to one embodiment the coating has a thickness which is at least 100 μm.

According to one embodiment the coating has a thickness that is in the range 200 to 800 μm. Tests performed by the inventors have shown that the total loss per winding layer is greatly reduced in this range of coating thickness.

According to one embodiment the magnetic material has a conductivity of an order of $1*10^6$ or less Siemens per meter.

According to one embodiment the magnetic material has a Steinmetz coefficient that is less than or equal to 20 W/m$^3$. The Steinmetz coefficient η, sometimes referred to as the Steinmetz constant or the hysteresis coefficient, is the magnetic loss coefficient in Steinmetz' equation $Q=\eta*B^{1.6}$, where B is the maximum induction. The inventors have conducted experiments which show that the loss reduction is substantially improved for magnetic materials having a very low magnetic loss coefficient, i.e. Steinmetz coefficient. In particular advantageous results where obtained for values of the Steinmetz coefficient of 20 or lower.

According to one embodiment, the magnetic material is an amorphous material.

According to one embodiment, the conductor has a first end terminal and a second end terminal defining portions of the conductor having both axial and radial extension, wherein the first end terminal and the second end terminal are without the layer. Thereby, the layer will not be connected to another layer when the cable is part of a winding of an electromagnetic device, thus eliminating the generation of a circulating current in the layer. Hence, losses due to circulating currents may be reduced.

According to one embodiment, the layer is a coating.

In a second aspect of the present disclosure there is provided an electromagnetic device comprising a magnetic core and windings arranged around the magnetic core, wherein the windings comprise at least one cable according to the first aspect presented herein.

According to one embodiment, the at least one cable has a first end terminal and a second end terminal, the at least one cable being arranged such that the layer at the first end terminal and the second end terminal is not electrically connected to a layer of any other cable that defines the windings.

According to one embodiment the electromagnetic device is a power transformer.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, byway of example, with reference to the accompanying drawings, in which.

DETAILED DESCRIPTION OF THE INVENTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

Figure 1A:
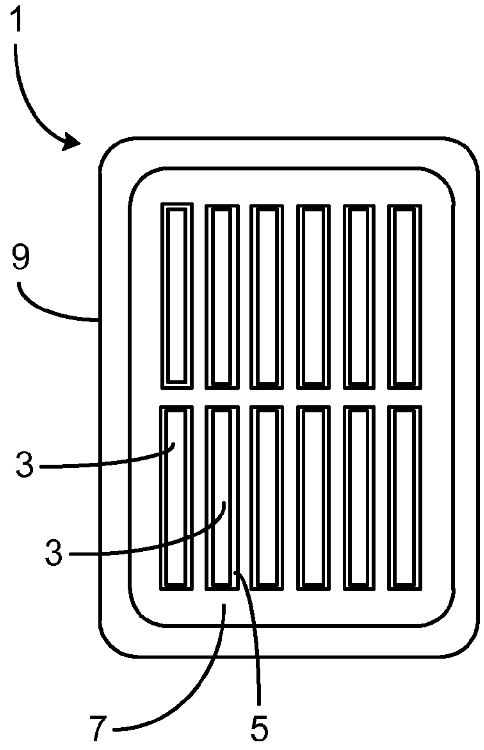
Fig. 1a (Prior art)
FIG. 1A is a cable for a winding of an electromagnetic device according to the prior art.

FIG. 1*a* is a cross-sectional view of a cable 1 for a winding according to the prior art. The cable 1, which may be a continuously transposed cable (CTC) for example, comprises a plurality of strands 3 acting as conductors for conducting current. The strands 3 are arranged adjacent each other axially to form a cable with a rectangular cross-section. Each strand 3 is provided with enamel 5 acting as an insulator. The plurality of strands 3 can be provided with a layer of epoxy 7 or a similar insulating material thus enclosing part of or the entire arrangement of strands 3. The layer of epoxy 7 can furthermore be provided with a layer of paper 9 or other cellulose-based material.

Figure 1B:
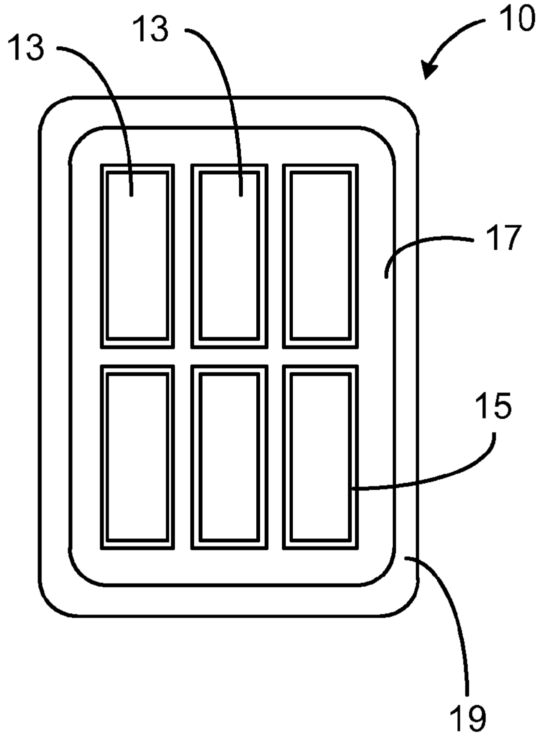
FIG. 1B is an example of a cable according to the present disclosure.

FIG. 1*b* is a cross-sectional view of one example of a cable 10 for a winding of an electromagnetic device. The cable 10 comprises one or more strands 13 of which each may have a larger cross-sectional dimension than the strands 3 of existing cables 1 for windings of an electromagnetic device. The strands 3 form a bundle of strands defining a conductor for conducting a current.

The strands may for example comprise copper, aluminium, a combination of copper and aluminium, or any other conductive material suitable for conducting current with low losses.

Each strand 13 may be provided with an insulating layer 15 comprising for example polymer of enamel 15 or any other suitable material. The strands 13 according to the example in FIG. 1*b* are arranged so as to form a rectangular shaped cross-section of the cable 10. Other cross-sectional shapes are also possible, examples being given in what follows.

The cable comprises a layer 17 comprising magnetic material. The layer 17 may according to one variation fully surround the bundle of strands 3, i.e. the conductor. To this end, the layer 17 may be concentrically arranged around the conductor along its longitudinal extension.

According to another variation, the layer may partly surround the conductor. For a rectangular cable, the layer may for example be arranged at two opposite sides of the conductor, e.g. by means of glue or other adhesive means. Such sides preferably correspond to the direction of the magnetic flux when the cable is arranged as a winding around a magnetic core of an electromagnetic device that is in an operational state. In other words, for such an embodiment, the layer may be arranged on the vertical sides of the cable when the cable is arranged as a winding around a magnetic core.

The cable may according to one embodiment further comprise a layer 19 of cellulose material such as paper. The layer 17 may be surrounded by the layer of cellulose material 19. It is to be noted that a cable according to the present disclosure does not necessarily need to be provided with the insulating layer 15 and/or the layer 19 of cellulose material.

Figure 2A:
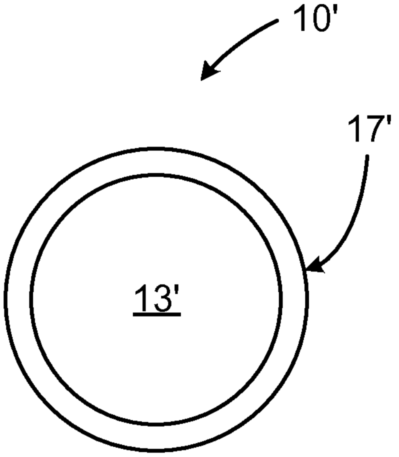
FIGS. 2A-B show examples of cables according to the present disclosure.
Figure 2B:
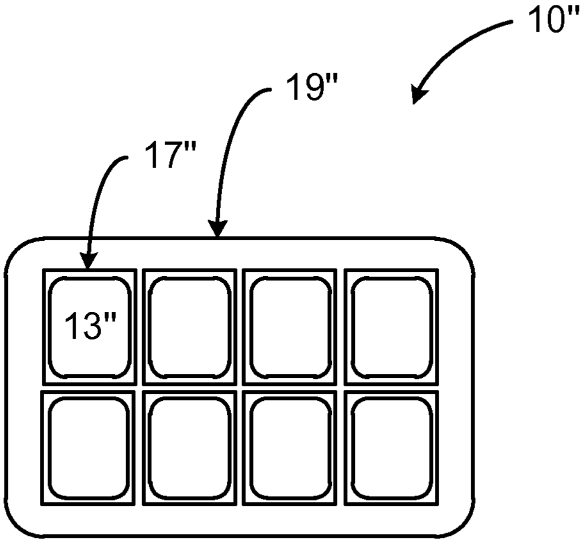

FIGS. 2*a* and 2*b* show further examples of possible cable geometries. FIG. 2*a* shows a cable 10' that has a circular cross-section and which comprises a single strand 13' acting as conductor for conducting current. Cable 10' further has a layer 17' surrounding the strand 13', and which layer 17' comprises a magnetic material.

FIG. 2*b* discloses another example of a cable 10". According to this example, the cable 10" comprises a plurality of strands 13", a layer 17" comprising a magnetic material, wherein the layer 17" is provided around each individual strand 3, and a layer of insulation 19" arranged around the bundle of strands 13".

The layer of insulation 19" may according to one variation be divided into several sub layers. The layer of insulation 19" may for instance comprise an inner insulating layer and an outer layer comprising magnetic material. Alternatively, the layer of insulation 19" may comprise an inner layer comprising magnetic material and an outer layer comprising an insulating material. The insulating material may for instance be paper and/or Nomex and/or epoxy glue and/or cross-linked polyethylene. One of the sub layers of the layer of insulation 19" may according to one variation comprise a semiconducting material.

In general, the order of layers, the insulating material, the magnetic material, any polymer, paper or semiconducting layer can be optimized for different applications i.e. loss level designs, voltages and safety.

According to one variation, the layer 17, 17', 17" comprises electrically insulating material with magnetic properties thus forming a composite insulating material. The magnetic properties are provided by the magnetic material. The magnetic material may for example be dispersed in the composite insulating material in the form of magnetic particles. Such composite insulating material can for instance be magnetised paper or magnetic particle filled epoxy.

The layer 17, 17', 17" may according to one variation be a single layer. Alternatively, the layer may comprise several sub layers. In the latter case, a layer of magnetic material may be surrounded by a layer of insulating material, or a layer of insulating material may be surrounded by a layer of magnetic material. These layers may according to various variations further be surrounded by additional layers of paper and epoxy, or paper and cross-linked polyethylene or only by a layer of cross-linked polyethylene.

Figure 3A:
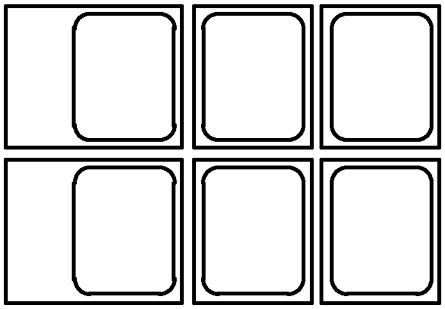
FIGS. 3A-B show examples of cables according to the present disclosure.
Figure 3B:
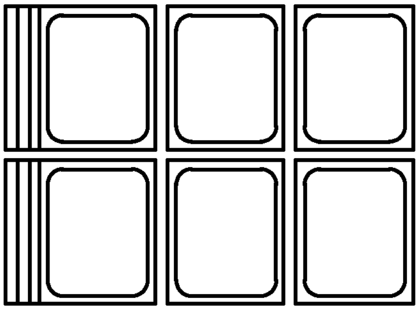

FIGS. 3*a* and 3*b* show cross-sectional views of variations of cables where the layer is thicker on those surfaces of the conductor which do not face any other conductor when the cable is formed as a winding. The layer may for example be thicker for those sections of the cable which, when the cable is arranged as a winding around a magnetic core, present the outermost cable turns of the inner winding, the surface with the thicker layer facing radially outwards. Moreover, the layer may for example be thicker for those sections of the cable which, when the cable is arranged around a magnetic core, present the innermost cable of the outer winding, the surface with the thicker layer facing radially inwards. Alternatively, the top and bottom surfaces of the cable may be provided with a thicker layer comprising magnetic material, the top and bottom surfaces being those surfaces which define the top and bottom of the cable when arranged as a winding around a magnetic core.

The thicker layer may for instance be defined by a single thick layer, as shown in FIG. 3*a* or several thinner sub layers as shown in FIG. 3*b*.

The cable according to the present disclosure has a first end terminal and a second end terminal arranged to be electrically connected so as to be fed by a current. The first end terminal and the second end terminal may be portions of the conductor having axial extensions, not only radial extensions. According to one variation, the cable is arranged such that the first end terminal and the second end terminal are free from, i.e. without, the layer of magnetic material. Thus there is no layer comprising magnetic material provided around the conductor at the first end terminal and the second end terminal. Thereby the layer comprising magnetic material cannot be electrically connected to a layer comprising magnetic material of any other cable that defines the windings. As a result, no net circulating currents which would provide further losses will be created in the layer comprising magnetic material during operation.

Figure 4A:
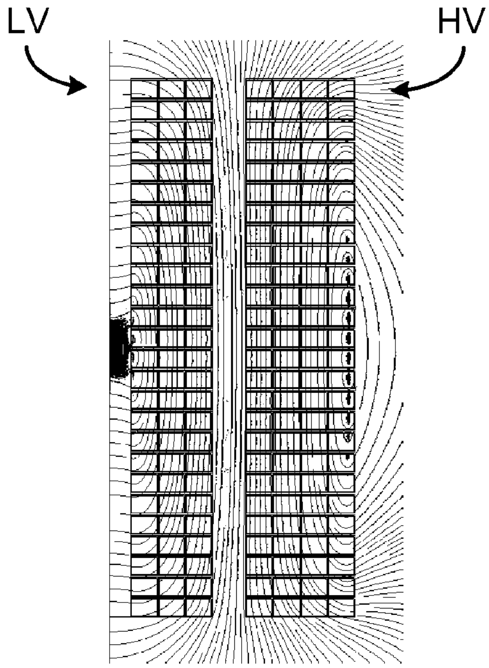
FIGS. 4A-C show the distribution of leakage flux in a winding of an electromagnetic device for three different values of the layer relative magnetic permeability.
Figure 4B:
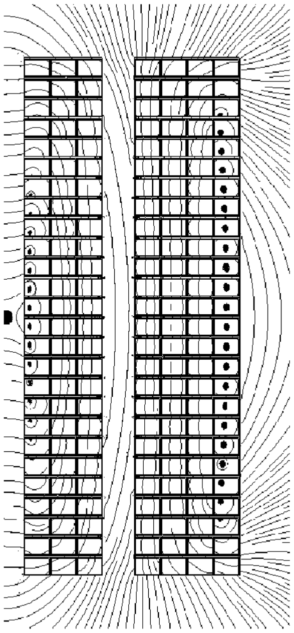
Figure 4C:
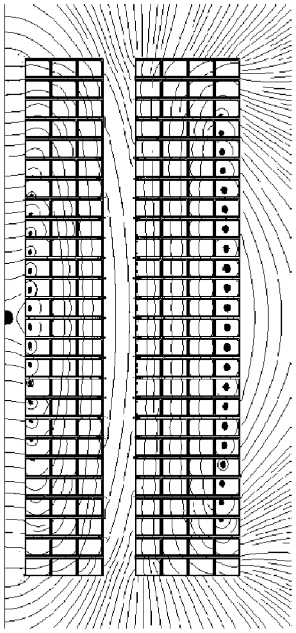

FIGS. 4*a-c* shows the distribution of the leakage flux in a winding of a high voltage electromagnetic device. In particular, axial cross-sectional views of one side along a symmetry axis of windings of an electromagnetic device are shown. According to this example, the layer thickness of the cable of which the winding is constructed is 300 μm. Low voltage windings LV to the left in each of the FIGS. 4*a-c* has for simplicity three turns/disc and the high voltage windings HV to the right in each of the FIGS. 4*a-c* has four turns/disc for simplicity, using CTC-type cables. The stranding is not shown in these figures. As can be seen, by increasing the relative permeability $\mu_r$ of the layer comprising magnetic material of the winding cables, the magnetic field, and hence the loss, inside the cables is reduced.

Figure 5:
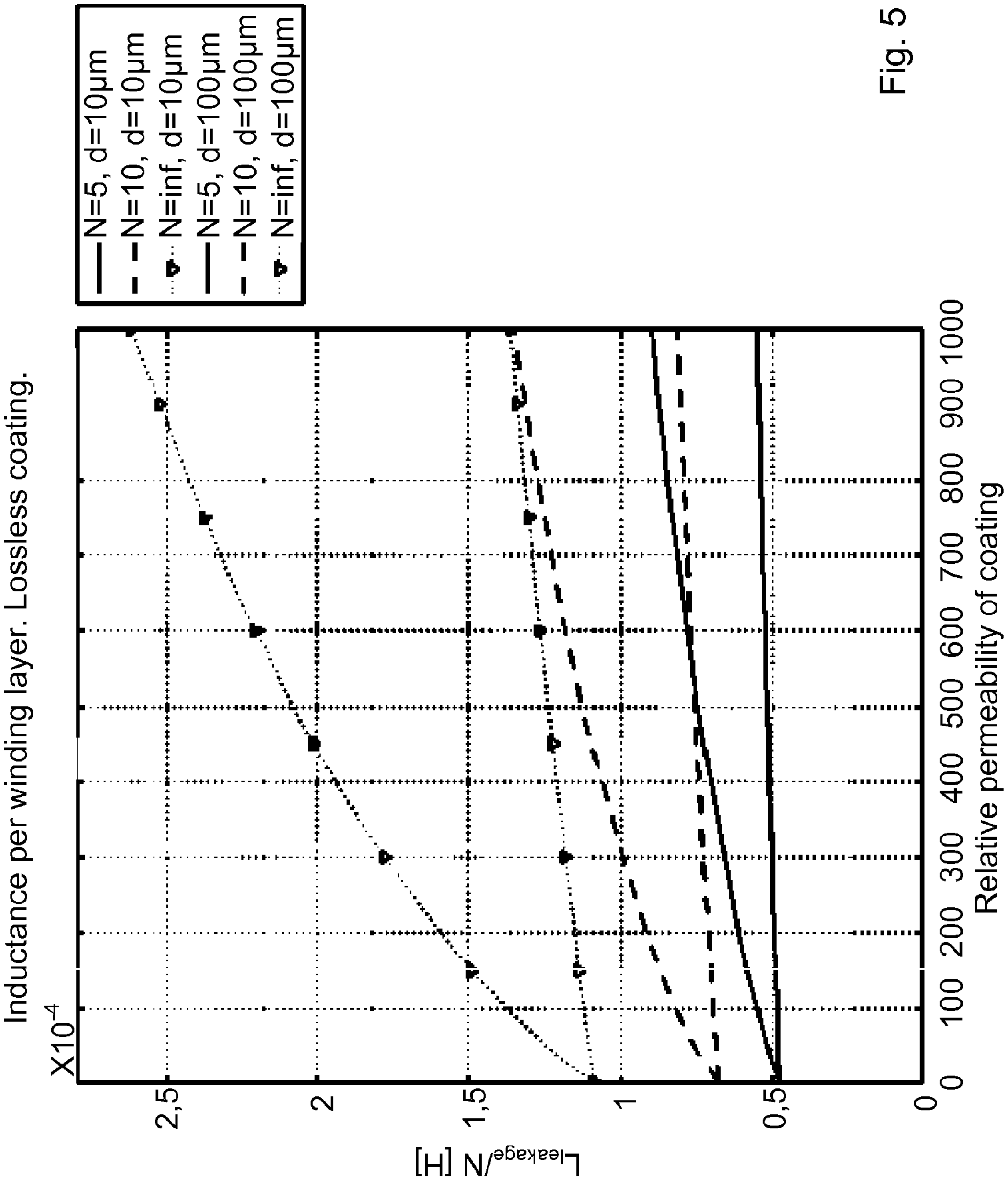
FIGS. 5 and 6 are graphs of the inductance and total loss per disc, respectively, plotted as functions of coating permeability at different values of coating thickness.

FIG. 5 shows the leakage inductance per winding disc, where N is the number of discs in the winding model, plotted as a function of layer permeability. The energy, and hence the inductance, increases with permeability due to magnetization of the layer and bending of field. It is to be noted that N=Inf represent a model where end effects are neglected, and describe the situation of a disc where flux direction is axial, d denotes the thickness of the layer.

Figure 6:
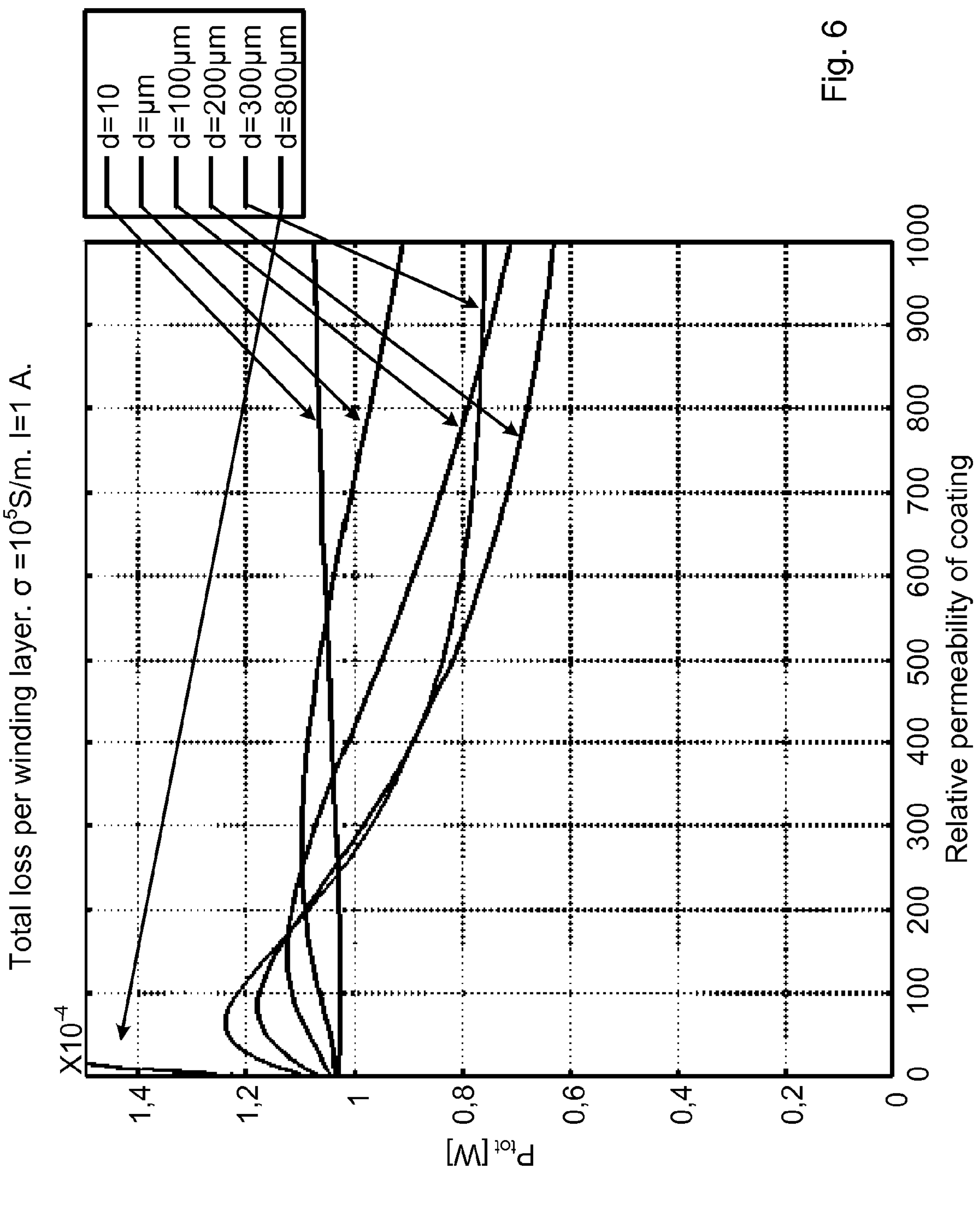

FIG. 6 shows the total loss per disc plotted as a function of relative permeability of the layer for different values of layer thickness. The conductivity of the coating is assumed to be $1*10^5$ S/m and load current is 1 A.

EXAMPLES

According to any example given herein, the magnetic material may have a relative permeability in the range 2 to 100000. Advantageously, the relative permeability of the magnetic material is in the range of 10 to 500. Alternatively, the relative permeability of the magnetic material is in the range 100-5000. Advantageously, the relative permeability of the magnetic material may be greater than 300, and preferably above 500.

A suitable magnetic material can for example be magnetic alloy 2605SA1. It is to be noted, however, that other materials exhibiting parameters within the ranges defined herein may also be used as magnetic material in the layer.

The layer may have a thickness which is at least 100 μm, preferably in the range 200 to 800 μm. The conductivity of the magnetic material is according to one example relatively low, the conductivity being of an order of 10000 or less Siemens per meter. According to one variation, the magnetic material has a Steinmetz coefficient having a value that is less than or equal to 20, preferably less than 10. Other variations of the magnetic material may exhibit a higher Steinmetz coefficient value than 20.

According to one variation, the magnetic material comprises an amorphous material. Alternatively, the magnetic material may comprise a crystalline material. The magnetic material may be ferromagnetic. According to one variation, the magnetic material has a saturation flux density of at least 0.5 tesla.

The layer may for example be a coating, a tape, a strip or a tube.

According to any embodiment presented herein, the conductor may for example comprise copper, aluminium, a combination of copper and aluminium, or any other conductive material suitable for conducting current with low losses, and which conductive material has a lower relative magnetic permeability than the relative magnetic permeability of the magnetic material.

The table below show properties of a suitable magnetic material.

| Property | Example of suitable range | Possible range |
|---|---|---|
| Permeability | 10-500 | 2-100000 |
| Conductivity | 100000 or lower | 10e7-10e−12 |
| Saturation flux density | 0.5 or higher | above 0 |
| Magnetic loss | low loss | |

The permeability is relative magnetic permeability (unit less)
Conductivity (Siemens per meter—S/m)
Saturation flux density (tesla)

There are several possibilities of how to apply the magnetic material to each strand or to the conductor formed by the bundle of strands.

The layer may for instance be a thin magnetized tape or magnetized paper similar to cellulose paper with magnetic particles dispersed in it.

Alternatively, a thin layer of magnetic material can be applied to the conductor or strand surface by suitable means e.g. by extrusion.

Suitably sized magnetic particles may be mixed with epoxy to form a gel and applied as a coating.

The magnetic particle may have origin in any ferromagnetic material in nature or artificially produced namely iron, cobalt nickel, their oxides and mixtures of all.

The magnetic material could be of crystalline structure with domains or amorphous types or a suitable mixture thereof.

The magnetic layer could be formed by mixing an insulating material with rare earth material as disclosed in Japanese patent application JP2006222322 which is incorporated herein by this reference.

The layer could be made of a thin amorphous ferromagnetic coating made of Fe75Si15B10 and applied by thermal spraying of spark-eroded powder, or Fe B Si C.

The magnetic material could be treated by suitable means to have higher permeability, as disclosed in U.S. Pat. No. 3,653,986, which is incorporated herein by this reference.

The strand insulation of an existing cable, the insulation typically being enamel as in a CTC cable, may remain as it is or can be replaced by a single layer of suitable material having both the magnetic and insulating function. In case of separate layer of insulation, e.g. enamel, and magnetic layer, the layers can be interchanged.

In addition to the above, to ease the path for leakage flux, the turns in the vicinity of a duct when the cable is arranged as a winding in an electromagnetic device may be covered with thicker magnetic strips to take care of the flux bending at the ends of the winding. The strips can act as a magnetic path for leakage flux and also an electrical shielding, hence improving the lightning voltage withstand of a disc winding.

In addition to above, the eddy current loss can also be reduced by redistributing the leakage flux by using pressboard cylinders in the duct having relative permeability greater than 1.

A winding defined by a cable as disclosed herein may be dipped in a ferro-fluid chamber, insulated from insulating liquid.

A cable as disclosed herein may be used for constructing a winding for an electromagnetic device. Such an electromagnetic device may for instance be a power transformer, a reactor or a generator. The cable 10, 10', 10" may advantageously be used for high voltage applications. Thus, the electromagnetic device may beneficially be a high voltage electromagnetic device. The cable may advantageously be used for 50-60 Hz applications.

The inventive concept has mainly been described above with reference to a few examples. However, as is readily appreciated by a person skilled in the art, other embodiments than the ones disclosed above are equally possible within the scope of the inventive concept, as defined by the appended claims.

Itemised List of Embodiments

1. A conductor for a winding of a high voltage electromagnetic device, wherein the conductor comprises:

a conducting element adapted to conduct a high voltage current, and at least one layer arranged around the conducting element, wherein the at least one layer extends along an axial direction of the conducting element, and which at least one layer comprises a magnetic material having a relative magnetic permeability which is greater than 100.

3. The conductor according to item 1, wherein the relative magnetic permeability is greater than 300.
4. The conductor according to any of the preceding items, wherein the relative magnetic permeability is greater than 500.
5. The conductor according to any of the preceding items, wherein the at least one layer is arranged concentrically around the conducting element.
6. The conductor according to any of the preceding items, wherein the magnetic material is ferromagnetic.
7. The conductor according to any of the preceding items, wherein the magnetic material is amorphous.
8. The conductor according to any of the preceding items, wherein the at least one layer has a thickness which is at least 100 μm.
9. The conductor according to any of the preceding items, wherein the at least one layer has a thickness which is in the range of 200-800 μm.
10. The conductor according to any of the preceding items, wherein the magnetic material has a conductivity of the order $10^5$ Siemens per meter or lower.
11. The conductor according to any of the preceding items, wherein the magnetic material has a Steinmetz coefficient which is less than 30 $W/m^3$.
12. The conductor according to any of the preceding items, wherein the magnetic material has a Steinmetz coefficient which is less than 20 $W/m^3$.
13. An electromagnetic device comprising an inductive core and windings arranged around the inductive core, wherein the windings comprise a conductor according to any of the items 1-12.
14. The electromagnetic device according to item 13, wherein the electromagnetic device is a high voltage transformer.

15. The electromagnetic device according to item 13, wherein the electromagnetic device is a high voltage reactor.

What is claimed is:

1. A cable for a winding of an electromagnetic device, wherein the cable comprises:

a conductor, and a layer comprising a magnetic material having a relative permeability in the range 100 to 5000, a conductivity of 100,000 or less S/m, a saturation flux density of 0.5 or higher tesla and a thickness that is in a range of from 200 to 800 μm, wherein the layer at least partly surrounds the conductor, and wherein the magnetic material has a Steinmetz coefficient that is less than or equal to 20 $W/m^3$.

2. The cable as claimed in claim 1, wherein the layer fully surrounds the conductor.

3. The cable as claimed in claim 1, wherein the magnetic material is ferromagnetic.

4. The cable as claimed in claim 1, comprising several concentrically arranged layers.

5. The cable as claimed in claim 4, wherein one of the layers comprises a semiconducting material.

6. The cable as claimed in claim 1, wherein the layer is thicker on those surfaces of the conductor which present the innermost or outermost turns of a winding for a specific application when the cable is formed as a winding.

7. The cable as claimed in claim 1, wherein the layer comprises an electrically insulating material with magnetic properties, wherein the magnetic properties are provided by the magnetic material.

8. The cable as claimed in claim 7, wherein the magnetic material is dispersed in the composite insulating material in the form of magnetic particles.

9. The cable as claimed in claim 1, wherein the electromagnetic device is a high voltage electromagnetic device.

10. The cable as claimed in claim 1, wherein the electromagnetic device is a power transformer.

11. The cable as claimed in claim 1, wherein the layer has a thickness which is at least 100 μm.

12. The cable as claimed in claim 1, wherein the magnetic material is an amorphous material.

13. The cable as claimed in claim 1, wherein the layer is a coating.

14. The cable as claimed in claim 1, wherein the conductor has a first end terminal and a second end terminal defining portions of the conductor having both axial and radial extension, wherein the first end terminal and the second end terminal are without the layer.

15. The cable as claimed in claim 14, wherein said conductor comprises a first conductor and said layer comprises a first layer, and a second cable comprising:

a second conductor, and a second layer comprising a second magnetic material having a relative permeability in the range 100 to 5000, a conductivity of 100,000 or less S/m, a saturation flux density of 0.5 or higher tesla and a thickness that is in a range of from 200 to 800 μm, wherein the second layer at least partly surrounds the second conductor, and wherein the second magnetic material has a Steinmetz coefficient that is less than or equal to 20 $W/m^3$.

16. The first and second cables as claimed in claim 15, wherein the second conductor has a first end terminal and a second end terminal defining portions of the second conductor having both axial and radial extension, wherein the first end terminal and the second end terminal of the second cable are without the layer such that losses due to circulating currents is reduced.

17. An electromagnetic device comprising a magnetic core and windings arranged around the magnetic core, wherein the windings comprise at least one cable according to claim 1.

18. The electromagnetic device as claimed in claim 17, wherein the electromagnetic device is a power transformer.

* * * * *